(12) United States Patent
Swei et al.

(10) Patent No.: US 8,804,450 B2
(45) Date of Patent: Aug. 12, 2014

(54) MEMORY CIRCUITS HAVING A DIODE-CONNECTED TRANSISTOR WITH BACK-BIASED CONTROL

(71) Applicant: Taiwan Semiconductor Manufacturing Company, Ltd., Hsinchu (TW)

(72) Inventors: Steven Swei, Fremont, CA (US); David B. Scott, Plano, TX (US)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

(21) Appl. No.: 13/790,726

(22) Filed: Mar. 8, 2013

(65) Prior Publication Data

US 2013/0188416 A1 Jul. 25, 2013

Related U.S. Application Data

(63) Continuation of application No. 12/769,973, filed on Apr. 29, 2010, now Pat. No. 8,411,525.

(51) Int. Cl.
*G11C 5/14* (2006.01)

(52) U.S. Cl.
USPC ........... 365/226; 365/227; 365/228; 365/229; 365/189.09

(58) Field of Classification Search
USPC .................... 365/226–229, 189.09
See application file for complete search history.

(56) References Cited

U.S. PATENT DOCUMENTS

| | | | |
|---|---|---|---|
| 5,461,338 A | 10/1995 | Hirayama et al. | |
| 7,501,849 B2 * | 3/2009 | Perisetty | 326/15 |
| 2003/0062948 A1 | 4/2003 | Notani et al. | |
| 2005/0007182 A1 | 1/2005 | Ando | |
| 2006/0104128 A1 | 5/2006 | Somasekhar et al. | |
| 2006/0226889 A1 * | 10/2006 | Gupta et al. | 327/534 |
| 2010/0117714 A1 | 5/2010 | Ikeda | |

OTHER PUBLICATIONS

Wang, Y., et al., "A 4.0 GHz 291Mb Voltage-Scalable SRAM Design in 32nm High-K Metal-Gate CMOS with Integrated Power Management", 2009 IEEE International Solid-State Circuits Conference.

* cited by examiner

*Primary Examiner* — Vu Le
*Assistant Examiner* — Han Yang
(74) *Attorney, Agent, or Firm* — Lowe Hauptman & Ham, LLP (57) ABSTRACT

A memory circuit including at least one memory array and at least one sleep transistor connected to the at least one memory array and connected to a first power line for providing a first power voltage. The memory circuit further includes at least one diode-connected transistor directly connected to the at least one memory array and directly connected to the first power line and a back-bias circuit electrically coupled with a bulk of the at least one diode-connected transistor.

20 Claims, 6 Drawing Sheets

MEMORY CIRCUITS HAVING A DIODE-CONNECTED TRANSISTOR WITH BACK-BIASED CONTROL

RELATED APPLICATIONS

This application is a continuation of U.S. application Ser. No. 12/769,973, entitled "Memory Circuits Having A Diode-Connected Transistor With Back-Biased Control," filed on Apr. 29, 2010, which is incorporated herein in its entirety.

TECHNICAL FIELD

The present disclosure relates generally to the field of semiconductor circuits, and more particularly, to memory circuits having a diode-connected transistor with a back-biased control.

BACKGROUND

Memory circuits have been used in various applications. Conventionally, memory circuits can include dynamic random access memory (DRAM) circuits, static random access memory (SRAM) circuits, and non-volatile memory circuits. A SRAM circuit includes a plurality of memory cells. For a conventional 6-T SRAM circuit in which arrays of memory cells are provided, each of the memory cells has six transistors. The 6-T SRAM memory cell is coupled with a bit line BL, a bit line bar BLB, and a word line WL. Four of the six transistors form two cross-coupled inverters for storing a datum representing "0" or "1". The remaining two transistors serve as access transistors to control the access of the datum stored within the memory cell.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the numbers and dimensions of the various features may be arbitrarily increased or reduced for clarity of discussion.

DETAILED DESCRIPTION

Conventionally, a SRAM circuit has a memory array electrically coupled to a sleep P-type metal-oxide-semiconductor (PMOS) transistor and a diode-connected PMOS transistor. During a data retention mode, the bulk and the source of the diode-connected PMOS transistor are electrically connected to the same power voltage $V_{CC}$. That is, a voltage difference between the bulk and the source of the diode-connected PMOS transistor is equal to 0. If the width/length (W/L) ratio and the current flowing through the diode-connected PMOS transistor are fixed, the voltage drop across the diode-connected PMOS transistor is fixed, too.

Applicants find that a voltage level on a node between the memory array and the diode-connected PMOS transistor is equal to the power voltage $V_{CC}$ minus the voltage drop across the diode-connected PMOS transistor. Since the voltage drop across the diode-connected PMOS transistor is fixed, the voltage level on the node cannot be changed. The fixed voltage level may not be suitable to compensate process-voltage-temperature (PVT) variations of the SRAM circuit.

It is understood that the following disclosure provides many different embodiments or examples. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

Figure 1:
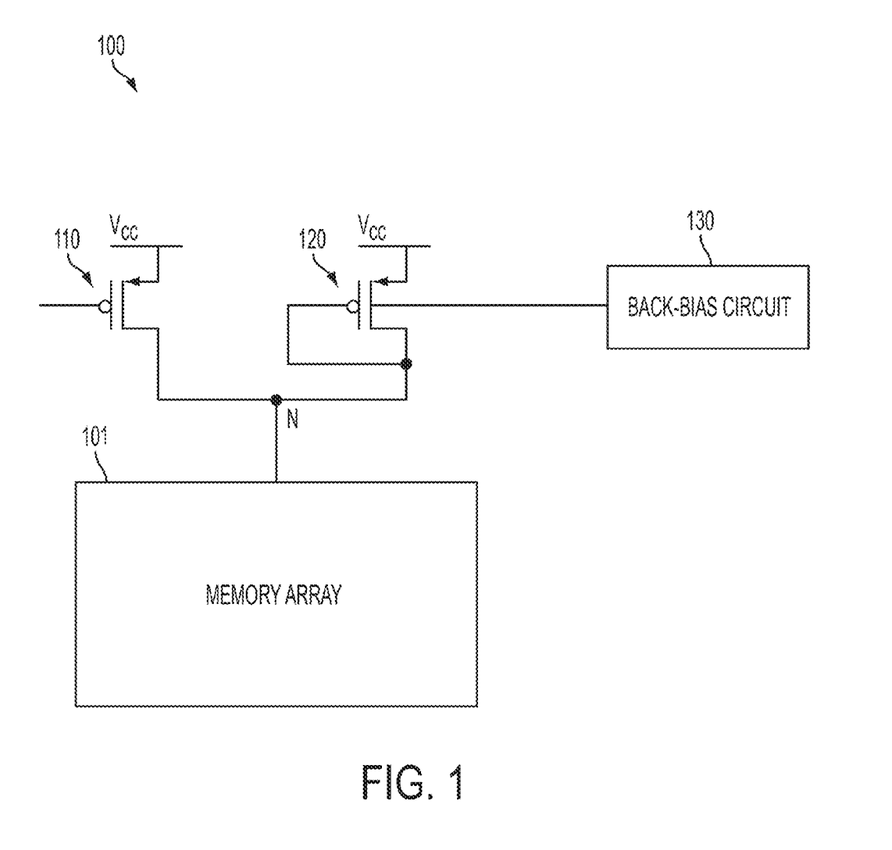
FIG. 1 is a schematic drawing illustrating an exemplary memory circuit including at least one diode-connected transistor electrically coupled with a memory array.

FIG. 1 is a schematic drawing illustrating an exemplary memory circuit including at least one diode-connected transistor electrically coupled with a memory array. In FIG. 1, a memory circuit 100 can include at least one memory array, e.g., a memory array 101. The memory array 101 can be electrically coupled with at least one sleep transistor, e.g., a sleep transistor 110, and at least one diode-connected transistor, e.g., a diode-connected transistor 120. The sleep transistor 110 and the diode-connected transistor 120 can be electrically coupled with a power line for providing a power voltage, e.g., power voltage $V_{CC}$. In some embodiments, the sleep transistor 110 can be parallel with the diode-connected transistor 120. The memory circuit 100 can include a back-bias circuit 130. The back-bias circuit 130 can be electrically coupled with a bulk of the diode-connected transistor 120. In some embodiments, the bulk of the diode-connected transistor 120 can be referred to as an n-type well region, a p-type well region, or a semiconductor substrate of the diode-connected transistor 120.

In some embodiments, the memory array 101 can include a plurality of memory cells (not shown). For some embodiments using an SRAM array, the memory array 101 can each include a plurality of word lines and a plurality of bit lines. The memory cells can each be electrically coupled with a bit line, a bit line bar, a word line, a first power source line for providing a power voltage, e.g., $V_{CC}$, and a second power source line for providing a power voltage, e.g., $V_{SS}$ or ground. In some embodiments, the memory array 101 can have 8, 16, 32, 64, 128 or more columns that can be arranged in word widths. In other embodiments, the word lines can be laid out substantially orthogonally to the bit lines. In still other embodiments, other arrangements of the word lines and bit lines can be provided.

In some embodiments, the memory circuit 100 can be a static random access memory (SRAM) circuit, an embedded SRAM circuit, a field programmable gate array (FPGA) circuit, or any type of memory circuit. It is noted that the numbers of the memory array 101, the sleep transistor 110, and/or the diode-connected transistor 120 described above in conjunction with FIG. 1 are merely exemplary. In some embodiments, one or more memory arrays, sleep transistors, and/or diode-connected transistors can be added. In other embodiments, the sleep transistor 110 and the diode-connected transistor 120 can be shared by two or more memory arrays.

Referring to FIG. 1, in some embodiments the sleep transistor 110 can be a P-type metal-oxide-semiconductor (PMOS) transistor. The diode-connected transistor 120 can be a diode-connected PMOS transistor. As shown in FIG. 1, a source (not labeled) of the diode-connected transistor 120 can be electrically coupled with the power line for providing the power voltage $V_{CC}$. In some embodiments, the back-bias circuit 130 can be configured to provide a voltage to the bulk of the diode-connected transistor 120 such that the source and the bulk of the diode-connected transistor 120 can be reverse biased during a data retention mode. In some embodiments, the back-bias circuit 130 can include a voltage divider, a plurality of series diodes, a plurality of series resistors, at least one switch, a multiplexer, at least one power source, one or more components that are suitable to be assembled to form the back-bias circuit 130, or any combinations thereof. In other embodiments, the back-bias circuit 130 can be any circuit that can be configured to adjust the voltage on the bulk of the diode-connected transistor 120.

Following is a description regarding an exemplary method of operating the memory circuit 100. During an access mode, e.g., a read and/or write mode, a control signal (not shown) having a voltage state, e.g., a low voltage state, can be applied to the sleep transistor 110 for turning on the sleep transistor 110. The turned-on sleep transistor 110 can electrically couple the power line with the memory array 101, such that the power voltage $V_{CC}$ can be electrically coupled with the memory array 101 for accessing data stored in the memory array 101. During the access mode, the diode-connected transistor 120, in some embodiments, can be turned on such that the power line can be electrically coupled with the memory array 101 through the turned-on diode-connected transistor 120, too.

Figure 6:
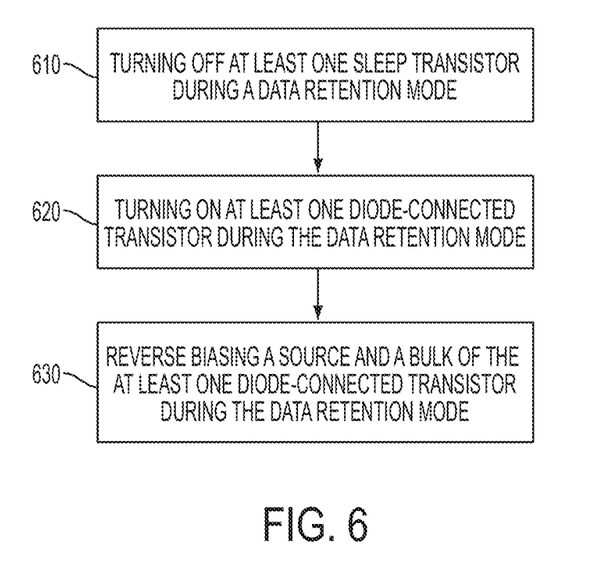
FIG. 6 is a schematic flow illustrating an exemplary method of operating a memory circuit during a data retention mode.

During a data retention mode, a control signal (not shown) having a voltage state, e.g., a high voltage state, can be applied to the sleep transistor 110 for turning off the sleep transistor 110 (step 610 shown in FIG. 6). The turned-off sleep transistor 110 can electrically isolate the power line from the memory array 101.

During the data retention mode, the diode-connected transistor 120 can be turned on (step 620 shown in FIG. 6). The turned-on diode-connected transistor 120 can electrically couple the power line with the memory array 101. The node N between the memory array 101 and the diode-connected transistor 120 can be electrically coupled with the power line that provides the power voltage $V_{CC}$.

As noted, the back-bias circuit 130 can be configured to adjust the voltage applied to the bulk of the diode-connected transistor 120 such that the source and the bulk of the diode-connected transistor 120 can be reverse biased (step 630 shown in FIG. 6). Due to the voltage difference between the source and the bulk of the diode-connected transistor 120, a voltage drop across the diode-connected transistor 120 can be adjusted. The adjusted voltage drop across the diode-connected transistor 120 can change a voltage level $V_{ccarray}$ on the node N. By changing the voltage level $V_{ccarray}$ on the node N, a current flowing through the memory array 101 for retaining the data stored therein can be changed. In some embodiments, the voltage level $V_{ccarray}$ on the node N can be adjusted such that the data stored in the memory array 101 can be maintained and the current provided to maintain the data stored in the memory array 101 can be reduced.

It is noted the flow sequence shown in FIG. 6 is merely exemplary. The scope of this application is not limited thereto. In some embodiments, the operation of the memory circuit 100 during the data retention mode can follow the sequence as shown in FIG. 6. In other embodiments, the steps 610-630 can be performed substantially simultaneously. In still other embodiments, the sequence of the steps 610-630 can be changed. In yet still other embodiments, the diode-connected transistor 120 is turned on during the access mode and the data retention mode. That is, the diode-connected transistor 120 is already turned on (step 620) before the data retention mode. The steps 610 and/or 630 can follow the step 620 and performed substantially simultaneously or with different sequences.

Figure 2:
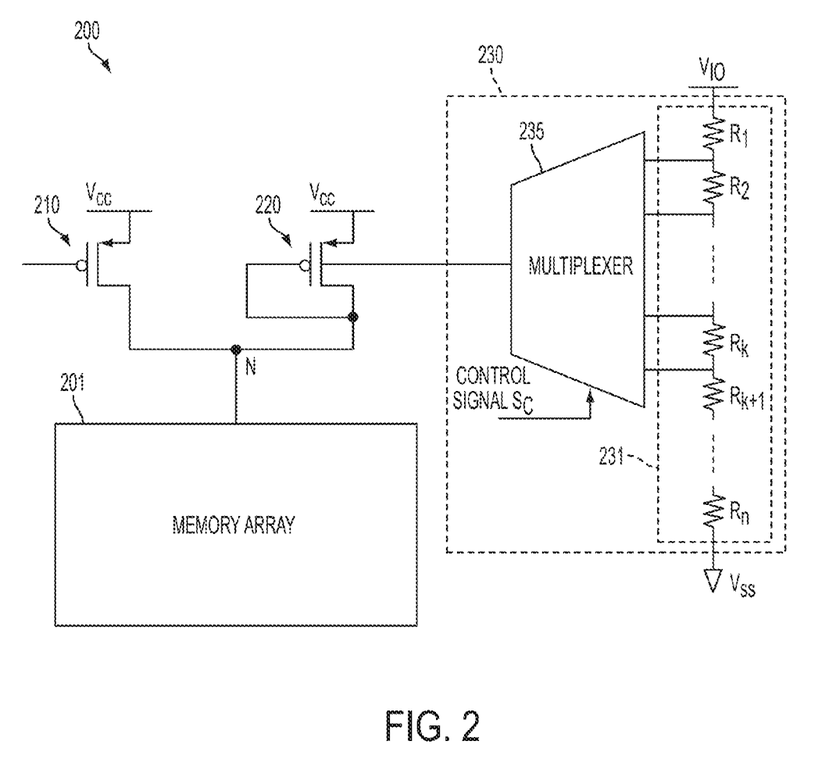
FIG. 2 is a schematic drawing illustrating another exemplary memory circuit including an exemplary back-bias circuit that includes a voltage divider.

FIG. 2 is a schematic drawing illustrating another exemplary memory circuit including an exemplary back-bias circuit that includes a voltage divider. Items of a memory circuit 200 in FIG. 2 that are the same or similar items of the integrated circuit 100 in FIG. 1 are indicated by the same reference numerals, increased by 100. In FIG. 2, a back-bias circuit 230 can include a voltage divider 231 electrically coupled with a multiplexer 235.

The voltage divider 231 can include a plurality of resistors, e.g., resistors $R_1$-$R_n$. In some embodiments, the resistors $R_1$-$R_n$ are connected in series, and the resistors $R_1$-$R_n$ can be electrically coupled between a power line for providing a power voltage, e.g., an input/output (I/O) voltage $V_{IO}$, and another power line for providing a power voltage, e.g., a power voltage $V_{SS}$ or ground. In some embodiments, the I/O voltage $V_{IO}$ can be larger than the power voltage $V_{CC}$. In some embodiments, the resistors $R_1$-$R_n$ can each include at least one well resistor, e.g., an n-well resistor (not shown), and/or at least one poly resistor (not shown). The well resistor can be formed in a semiconductor substrate (not shown). The poly resistor can be disposed over and electrically coupled with the well resistor, such that an area can accommodate both the well resistor and the poly resistor.

Referring to FIG. 2, the multiplexer 235 can be electrically coupled with the bulk of the diode-connected transistor 220. Each node between two neighboring resistors can be electrically coupled with the multiplexer 235. In some embodiments, the nodes of the voltage divider 231 can be referred to as output nodes. Various voltage levels on the nodes of the voltage divider 231 can be provided to the multiplexer 235.

During the data retention mode, a control signal $S_C$ can be applied to the multiplexer 235, selecting one of the voltage levels on the nodes of the voltage divider 231. The selected voltage level is then electrically coupled to the bulk of the diode-connected transistor 220. It is noted that the back-bias circuit 230 described above in conjunction with FIG. 2 is merely exemplary. In some embodiments, the voltage divider 231 can include a plurality of diodes and/or transistors. In other embodiments, the multiplexer 235 can include a plurality of switches. Each switch can be electrically coupled with a corresponding node of the voltage divider 231. The control signal $S_C$ applied to the multiplexer 235 can turn on and/or off one or more of the switches.

Figure 3:
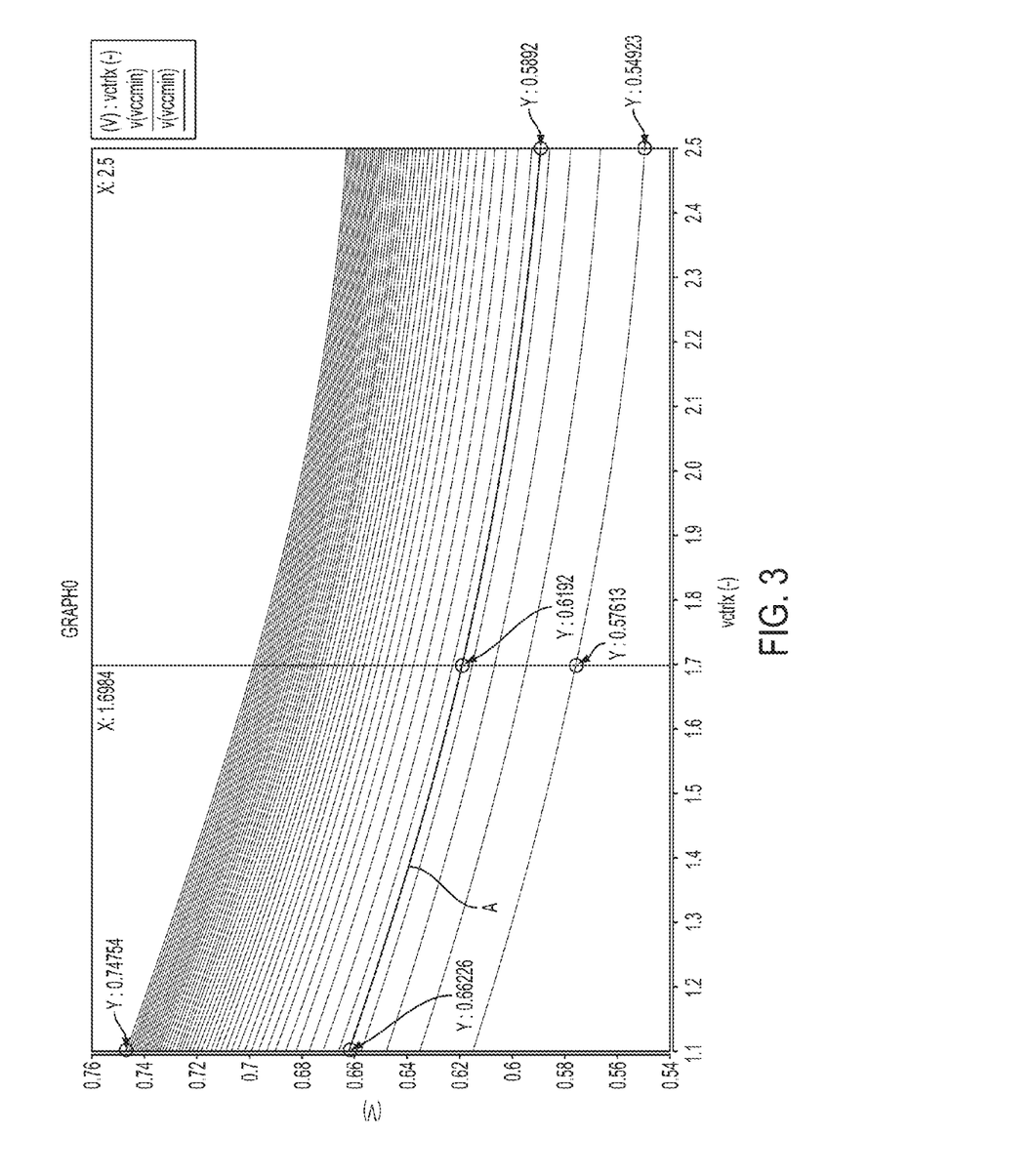
FIG. 3 is a simulation result illustrating some curves representing changes of the voltage level $V_{ccarray}$ on the node N.

FIG. 3 is a simulation result illustrating a plurality of curves representing changes of the voltage level $V_{ccarray}$ on the node N. In FIG. 3, the horizontal axis represents the voltage applied to the bulk of the diode-connected transistor 220 shown in FIG. 2. The vertical axis represents the voltage level $V_{ccarray}$ on the node N between the memory array 201 and the diode-connected transistor 220. The curves shown in FIG. 3 are generated from simulations by varying the width/length (W/L) ratio of the diode-connected transistor 220. Each curve represents the change of the voltage level of $V_{ccarray}$ on the node N in response to the change of the voltage applied to the bulk of the diode-connected transistor 220.

In some embodiments, the power voltage $V_{CC}$ can be about 1.1 V. The voltage level of $V_{ccarray}$ on the node N may change from about 0.662 V to about 0.589 V in response to the change of the bulk voltage of the diode-connected transistor 220, e.g., from about 1.1 V to about 2.5 V, as shown by the curve A. In other embodiments, by changing the W/L ratio of the diode-connected transistor 220 the voltage level of $V_{ccarray}$ on the node N may be adjustable from about 0.748 V to about 0.549 V.

Figure 4:
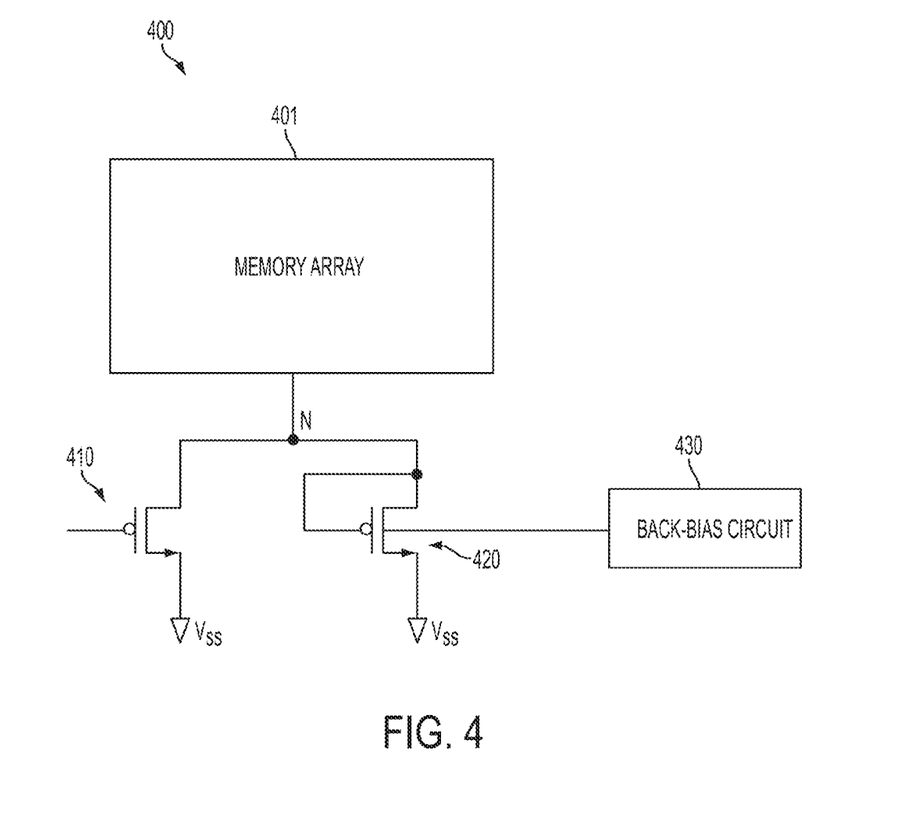
FIG. 4 is a schematic drawing illustrating another exemplary memory circuit including a back-bias circuit.

FIG. 4 is a schematic drawing illustrating another exemplary memory circuit including a back-bias circuit. Items of a memory circuit 400 in FIG. 4 that are the same or similar items of the integrated circuit 100 in FIG. 1 are indicated by the same reference numerals, increased by 300. In FIG. 4, a sleep transistor 410 is an NMOS transistor. A diode-connected transistor 420 is a diode-connected NMOS transistor. The sleep transistor 410 and the diode-connected transistor 420 can be electrically coupled with a power line for providing a power voltage, e.g., power voltage $V_{SS}$ or ground. In some embodiments, the sleep transistor 410 can be parallel with the diode-connected transistor 420.

The method of operating the memory circuit 400 during a data retention mode is similar to that described above in conjunction with FIG. 1. Due to the use of the different type transistors for the sleep transistor 410 and the diode-connected transistor 420, the voltage levels and/or states applied to the transistors and/or the node N can be different or opposite. Additionally, the back-bias circuit 430 can be configured to provide a voltage to the bulk of the diode-connected transistor 420. In some embodiments, the absolute value of the voltage is larger than the absolute value of the power voltage $V_{SS}$. In other embodiments, the back-bias circuit 430 can provide a negative voltage to the bulk of the diode-connected transistor 420.

Figure 5:
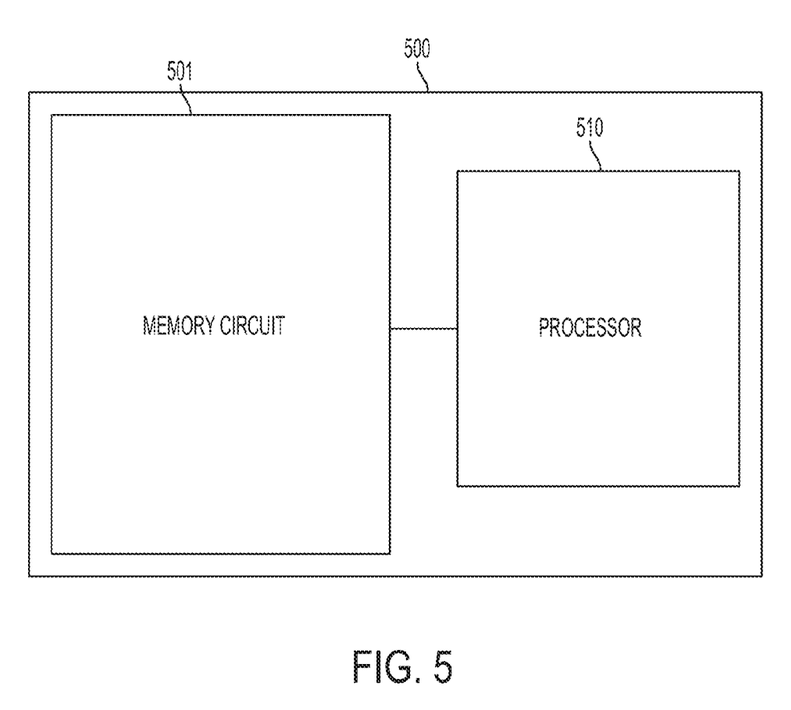
FIG. 5 is a schematic drawing showing a system including an exemplary memory circuit.

FIG. 5 is a schematic drawing showing a system including an exemplary memory circuit. In FIG. 5, a system 500 can include a processor 510 coupled with a memory circuit 501. The memory circuit 501 can be similar to one of the memory circuits 100, 200, and 400 described above in conjunction with FIGS. 1, 2, and 4, respectively. The processor 510 can be a processing unit, central processing unit, digital signal processor, or other processor that is suitable for accessing data of memory circuit.

In some embodiments, the processor 510 and the memory circuit 501 can be formed within a system that can be physically and electrically coupled with a printed wiring board or printed circuit board (PCB) to form an electronic assembly. The electronic assembly can be part of an electronic system such as computers, wireless communication devices, computer-related peripherals, entertainment devices, or the like.

In some embodiments, the system 500 including the memory circuit 501, together with other integrated circuits (not shown) can provide an entire system in one IC, so-called system on a chip (SOC) or system on integrated circuit (SOIC) devices. These SOC devices may provide, for example, all of the circuitry needed to implement a cell phone, personal data assistant (PDA), digital VCR, digital camcorder, digital camera, MP3 player, or the like in a single integrated circuit.

One aspect of this description relates to a memory circuit. The memory circuit includes at least one memory array and at least one sleep transistor connected to the at least one memory array and connected to a first power line for providing a first power voltage. The memory circuit further includes at least one diode-connected transistor directly connected to the at least one memory array and directly connected to the first power line and a back-bias circuit electrically coupled with a bulk of the at least one diode-connected transistor.

Another aspect of this description relates to a system, the system including a processor and a memory circuit electrically coupled to the processor. The memory circuit includes at least one memory array and at least one sleep transistor connected to the at least one memory array and connected to a first power line for providing a first power voltage. The memory circuit further includes at least one diode-connected transistor directly connected to the at least one memory array and directly connected to the first power line and a back-bias circuit electrically coupled with a bulk of the at least one diode-connected transistor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory circuit comprising:
   at least one memory array;
   at least one sleep transistor connected to the at least one memory array and connected to a first power line for providing a first power voltage;
   at least one diode-connected transistor directly connected to the at least one memory array and directly connected to the first power line; and
   a back-bias circuit electrically coupled with a bulk of the at least one diode-connected transistor.

2. The memory circuit of claim 1, wherein the at least one sleep transistor is connected in parallel with the at least one diode-connected transistor.

3. The memory circuit of claim 1, wherein the back-bias circuit comprises a plurality of transistors connected in series between a second power line for providing a second power voltage and a third power line for providing a third power voltage.

4. The memory circuit of claim 3, wherein the second power voltage is greater than the first power voltage.

5. The memory circuit of claim 3, wherein the first power voltage is substantially equal to the third power voltage.

6. The memory circuit of claim 1, wherein the back-bias circuit is configured to provide a voltage to the bulk of the at least one diode-connected transistor ranging from about 1.1 volts to about 2.5 V.

7. The memory circuit of claim 1, further comprising a node between the at least one diode-connected transistor and the memory array, wherein a voltage level at the node ranges from about 0.662 V to about 0.589 V in response to a voltage applied to the bulk of the at least one diode-connected transistor.

8. The memory circuit of claim 1, further comprising a node between the at least one diode-connected transistor and the memory array, wherein a voltage level at the node ranges from about 0.748 V to about 0.549 V in response to a voltage applied to the bulk of the at least one diode-connected transistor.

9. The memory circuit of claim 1, wherein the back-bias circuit comprises a multiplexer configured to receive a control signal.

10. A system comprising:
a processor; and
a memory circuit electrically coupled to the processor, the memory circuit comprising:
at least one memory array;
at least one sleep transistor electrically coupled to both the at least one memory array and a first power line for providing a first power voltage;
at least one diode-connected transistor is turned on and electrically coupled to both the at least one memory array and the first power line during an entire period of operation; and
a back-bias circuit electrically coupled with a bulk of the at least one diode-connected transistor.

11. The system of claim 10, wherein the at least one transistor is connected in parallel with the at least one diode-connected transistor.

12. The system of claim 10, wherein the back-bias circuit comprises a plurality of transistors connected in series between a second power line for providing a second power voltage and a third power line for providing a third power voltage.

13. The system of claim 12, wherein the second power voltage is greater than the first power voltage.

14. The system of claim 12, wherein the first power voltage is substantially equal to the third power voltage.

15. The system of claim 10, wherein the back-bias circuit is configured to provide a voltage to the bulk of the at least one diode-connected transistor ranging from about 1.1 volts to about 2.5 V.

16. The system of claim 10, further comprising a node between the at least one diode-connected transistor and the memory array, wherein a voltage level at the node ranges from about 0.662 V to about 0.589 V in response to a voltage applied to the bulk of the at least one diode-connected transistor.

17. The system of claim 10, further comprising a node between the at least one diode-connected transistor and the memory array, wherein a voltage level at the node ranges from about 0.748 V to about 0.549 V in response to a voltage applied to the bulk of the at least one diode-connected transistor.

18. The system of claim 10, wherein the back-bias circuit comprises a multiplexer configured to receive a control signal.

19. The system of claim 10, further comprising a printed circuit board, wherein the processor and the memory circuit are connected to the printed circuit board.

20. The system of claim 10, wherein the processor is a digital signal processor.

* * * * *